(12) United States Patent
Chen et al.

(10) Patent No.: US 9,347,989 B2
(45) Date of Patent: May 24, 2016

(54) TEST DEVICE FOR TESTING A POP STACKED-CHIP

(71) Applicant: CHROMA ATE INC., Taoyuan County (TW)

(72) Inventors: Chien-Ming Chen, Taoyuan County (TW); Meng-Kung Lu, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 496 days.

(21) Appl. No.: 13/875,660

(22) Filed: May 2, 2013

(65) Prior Publication Data
US 2013/0293254 A1    Nov. 7, 2013

(30) Foreign Application Priority Data

May 3, 2012 (TW) .............................. 101115837 A
Mar. 4, 2013 (TW) .............................. 102107529 A

(51) Int. Cl.
*G01R 31/00* (2006.01)
*G01R 31/28* (2006.01)

(52) U.S. Cl.
CPC ........ *G01R 31/2887* (2013.01); *G01R 31/2896* (2013.01)

(58) Field of Classification Search
CPC .............. G01R 31/28; G01R 31/2887; G01R 31/2896; G01R 31/2886; G01R 31/0483; G01R 31/0466; G01R 31/0433; G01R 31/2893; G01R 31/2851; G01R 1/07342; G01R 1/06711; G01R 1/06738; G01R 1/06772; G01R 31/31924; G01R 31/3004; G01R 31/2884; G01R 31/31922; G01R 31/0408

USPC ............ 324/756.01–756.03, 755.22, 754.01, 324/754.03, 754.07–754.11, 754.13, 324/754.14, 757.03, 755.01, 755.11, 324/762.01–762.05, 757.01–757.05

See application file for complete search history.

(56) References Cited

U.S. PATENT DOCUMENTS

| | | | | |
|---|---|---|---|---|
| 5,065,495 A | * | 11/1991 | Narushima | B25B 11/005 269/21 |
| 6,462,534 B2 | * | 10/2002 | Kang | G01R 31/2867 324/750.05 |
| 8,269,519 B1 | * | 9/2012 | Mardi | G01R 31/2898 324/758.01 |
| 2002/0060581 A1 | * | 5/2002 | Okamoto | G01R 31/2868 324/750.08 |
| 2006/0220667 A1 | * | 10/2006 | Tashiro | G01R 31/2887 324/750.25 |
| 2007/0170938 A1 | * | 7/2007 | Chen | G01R 1/0466 324/750.2 |
| 2008/0211486 A1 | * | 9/2008 | Moriyama | G01K 1/026 324/757.04 |
| 2011/0018570 A1 | * | 1/2011 | Chen | B08B 5/04 324/758.01 |
| 2011/0279136 A1 | * | 11/2011 | Shiozawa | G01R 31/2891 324/750.23 |
| 2012/0074589 A1 | * | 3/2012 | Mardi | H01L 21/563 257/777 |
| 2013/0099812 A1 | * | 4/2013 | Wang | G01R 31/2889 324/755.01 |

* cited by examiner

*Primary Examiner* — Tung X Nguyen
*Assistant Examiner* — Thang Le
(74) *Attorney, Agent, or Firm* — Locke Lord LLP; Tim Tingkang Xia, Esq.

(57) ABSTRACT

A test device is provided for testing a bottom chip of a package-on-package (PoP) stacked-chip. An upper surface of the bottom chip has a plurality of soldering points for electrically connecting a plurality of corresponding soldering points of a top chip of the PoP stacked-chip. The test device includes a test head and a plurality of test contacts. The test head has the top chip installed inside. The plurality of test contacts is installed on a lower surface of the test head and electrically connected to the plurality of corresponding soldering points of the top chip inside the test head. When the lower surface of the test head contacts the upper surface of the bottom chip, the plurality of test contacts is electrically connected to the plurality of soldering points for testing the bottom chip.

6 Claims, 16 Drawing Sheets

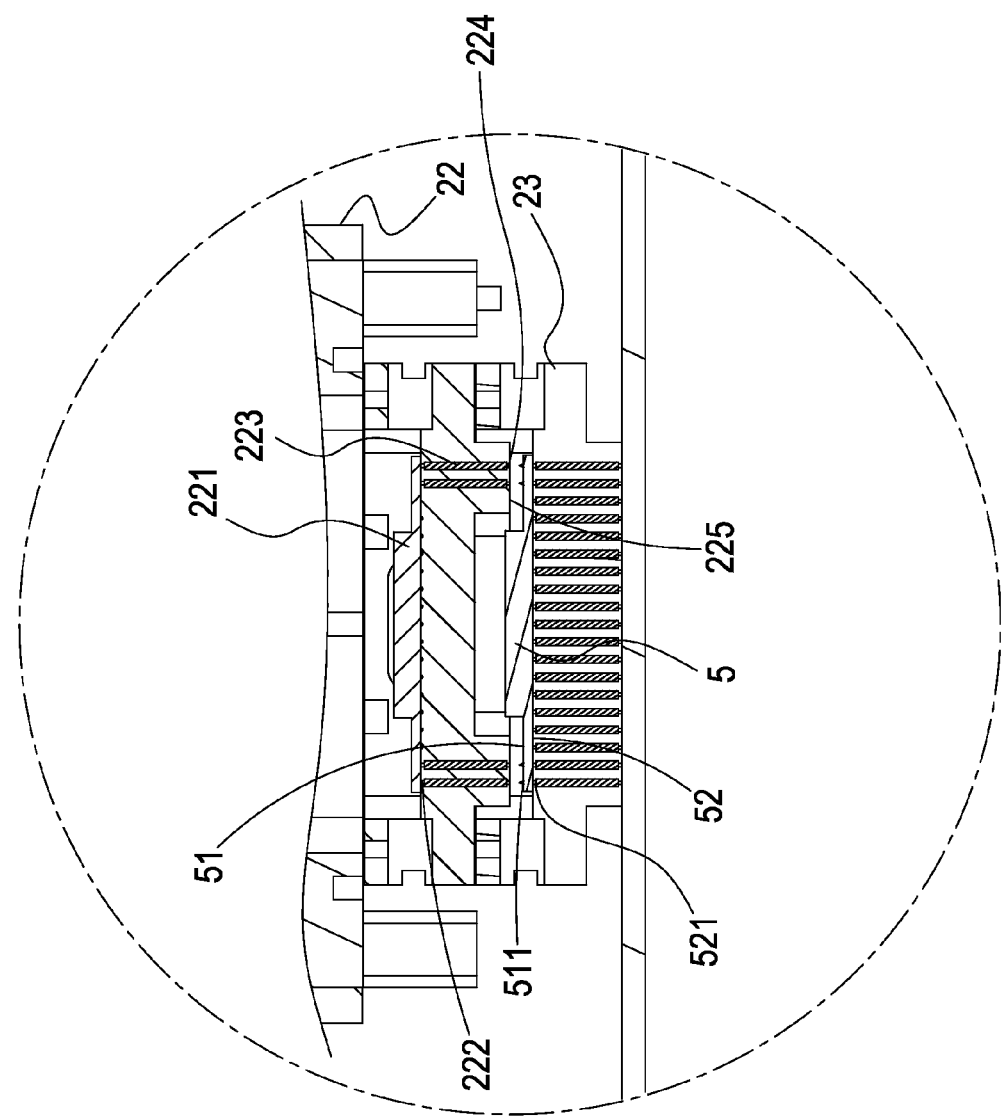

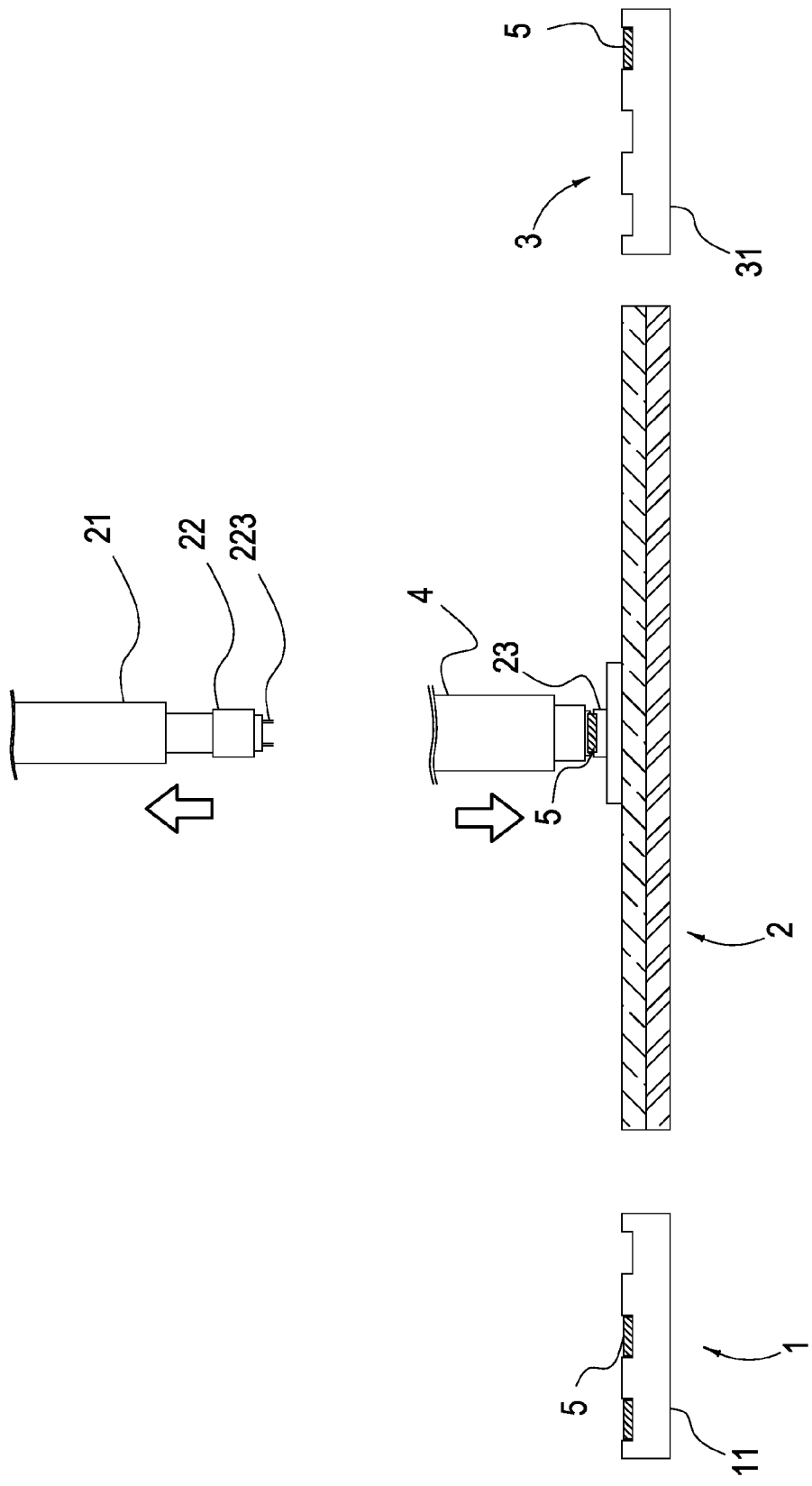

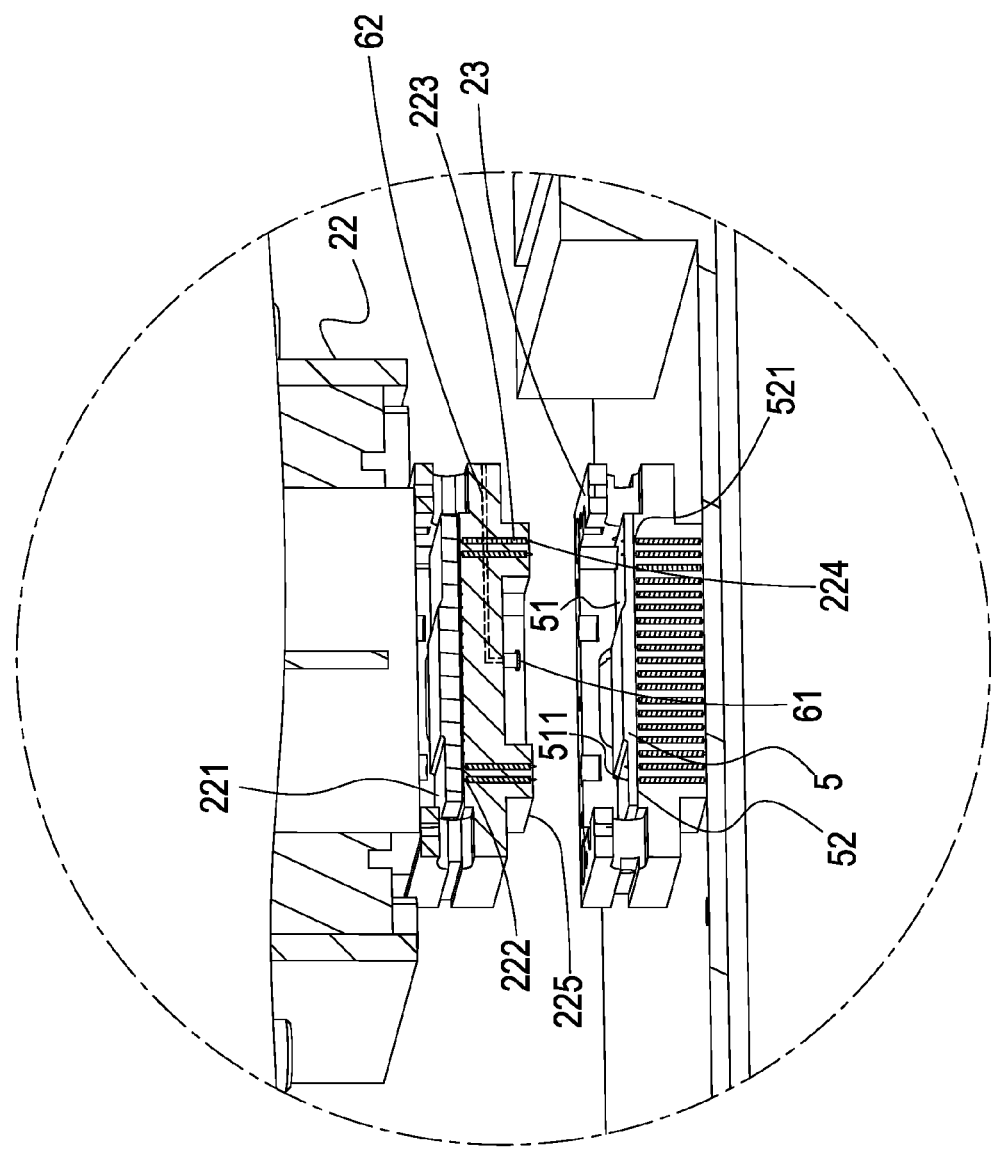

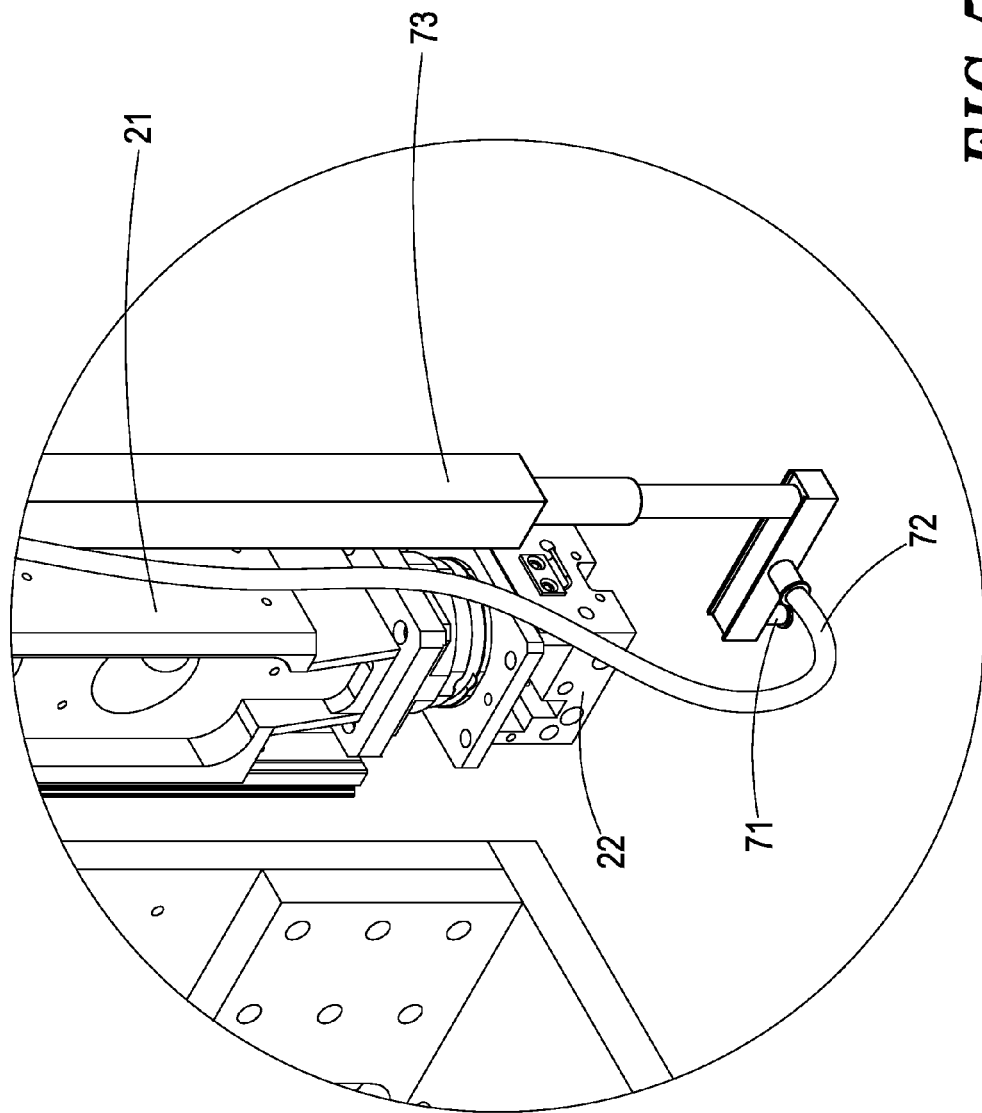

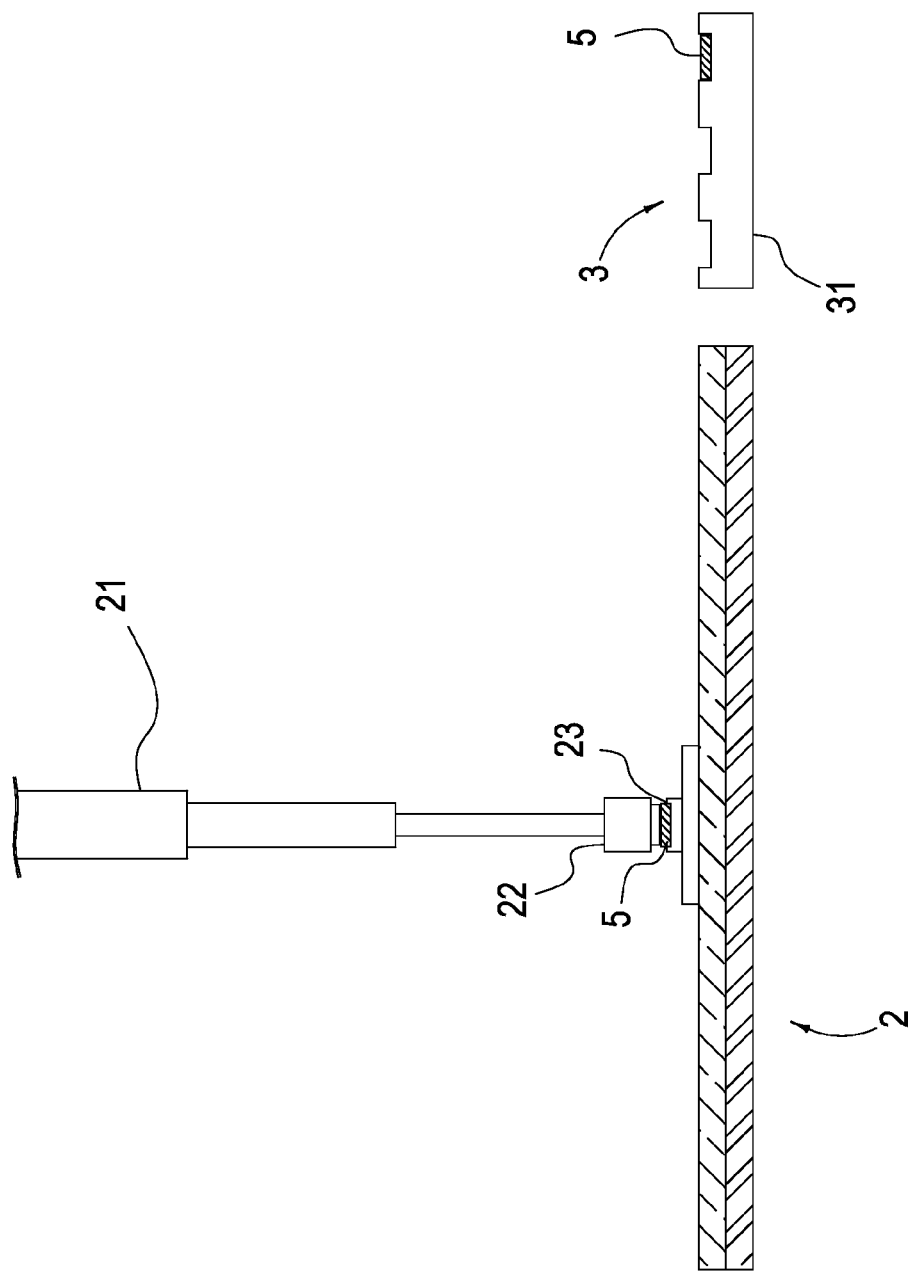
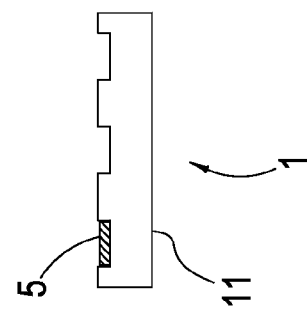

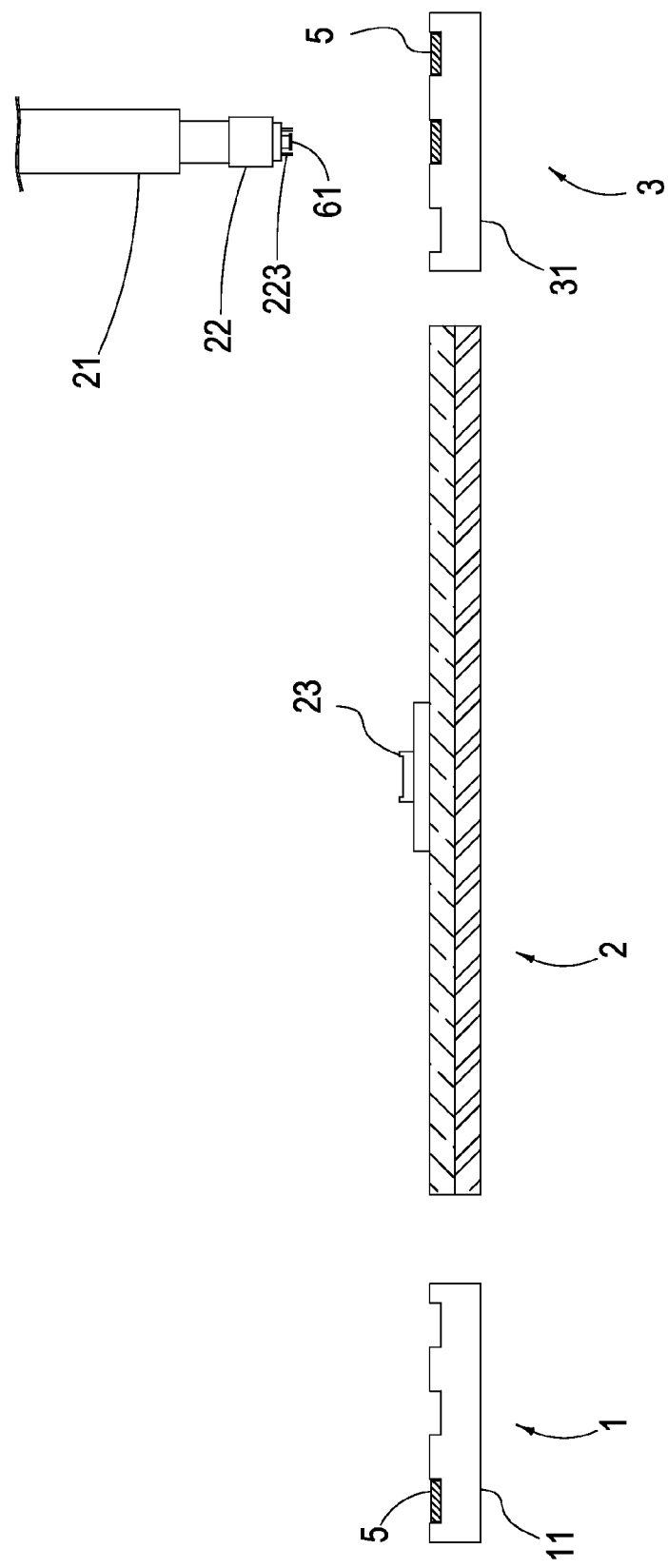

TEST DEVICE FOR TESTING A POP STACKED-CHIP

The current application claims foreign priorities to the patent applications of Taiwan No. 101115837 filed on May 3, 2012 and No. 102107529 filed on Mar. 4, 2013.

BACKGROUND OF THE INVENTION

1. Field of the Invention

The present invention generally relates to a test device for testing a package-on-package (PoP) stacked-chip; in particular, the present invention relates to a test device including a test head having a top chip of a PoP stacked-chip installed inside, for testing a bottom chip of the PoP stacked-chip.

2. Description of Related Art

Currently available portable electronic products like smartphones, mobile computing products and various electronic consumer devices all seek higher semiconductor functionalities and performance under the conditions of limited occupation areas and least thickness and weight with the lowest fabrication costs, so certain manufacturers have recognized such trends and devoted efforts specifically on the integration of semiconductor chips, and also developed three-dimensional packaging technology such as die stacking and package stacking.

The package stacking can be generally categorized into two types, respectively referred as package-on-package (PoP) and package-in-package (PiP). More specifically, in terms of the integral structure of PoP, at present, the technology utilized in industry can lay out more than one hundred contacts on a single chip of square centimeter area, which typically comprises a two-layer structure consisting of a first package (top package) and a second package (bottom package), wherein the first package (top package) is stacked on top of the second package (bottom package), with each package surface including more than one hundred micro contacts (solder balls) for soldering connection, and then the contacts respectively on the first package and the second package are mutually connected by means of precision soldering technologies. So far, the chip-under-test fabricated in this way is still individually inspected all through visual and manual test operations. In the PoP stacked-chip, upon stack integrating the top chip with the bottom chip, it is necessary to perform test processes on final test yield. Therefore, in a conventional stacked-chip package, it is required to manually place an individual top chip onto an individual bottom chip in stack, and then press down the test arm to abut against the surface of the top chip already stacked on top of the bottom chip so as to perform the final test. However, in case that low yields or continuous errors do occur from the test results, it may become difficult to clearly differentiate whether the top chip or the bottom one causes such problems. Seeking other approaches for solution may complicate the entire process, if unable to efficiently identify the problem source.

SUMMARY OF THE INVENTION

The invention provides a test device for testing a package-on-package (PoP) stacked-chip to solve the above mentioned problem and others.

An embodiment of the present invention provides a test device for testing a bottom chip of a PoP stacked-chip. An upper surface of the bottom chip has a plurality of soldering points for electrically connecting a plurality of corresponding soldering points of a top chip of the PoP stacked-chip. The test device comprises a test head and a plurality of test contacts. The test head has the top chip installed inside. The plurality of test contacts is installed on a lower surface of the test head, and electrically connected to the plurality of corresponding soldering points of the top chip inside the test head. When the lower surface of the test head contacts the upper surface of the bottom chip, the plurality of test contacts is electrically connected to the plurality of soldering points for testing the bottom chip.

Another embodiment of the present invention provides a test device for testing a bottom chip of a PoP stacked-chip. An upper surface of the bottom chip has a plurality of soldering points for electrically connecting a plurality of corresponding soldering points of a top chip of the PoP stacked-chip. The test device comprises a test head, a plurality of test probes, a nozzle, and an air flow passage. The test head has the top chip installed inside. The first end of the plurality of the test probes is electrically connected to the corresponding soldering points of the top chip inside the test head, and the second ends of the test probes extending outward from a lower surface of the test head. The nozzle is installed about the center of the lower surface of the test head, for vacuum absorbing the bottom chip. The air flow passage penetrates the test head and connecting the nozzle, for exhausting the air flow so as to generate the absorbing force.

Other features of the present invention will be apparent from the accompanying drawings and from the detailed description which follows.

BRIEF DESCRIPTION OF THE DRAWINGS

FIG. 2 illustrates the second embodiment of the test device of the present invention;

FIG. 3A to FIG. 3G illustrate the operation of the test device in the first embodiment of the present invention;

FIG. 4 illustrates the third embodiment of the test device of the present invention;

FIG. 5A and FIG. 5B illustrate the fourth embodiment of the test device of the present invention; and FIG. 6A to FIG. 6C illustrate the operation of the test device in the third embodiment of the present invention.

DETAILED DESCRIPTION OF THE PREFERRED EMBODIMENTS

The aforementioned and other technical contents, aspects and effects in relation with the present invention can be clearly appreciated through the detailed descriptions concerning the preferred embodiments of the present invention in conjunction with the appended drawings.

Figure 1A:
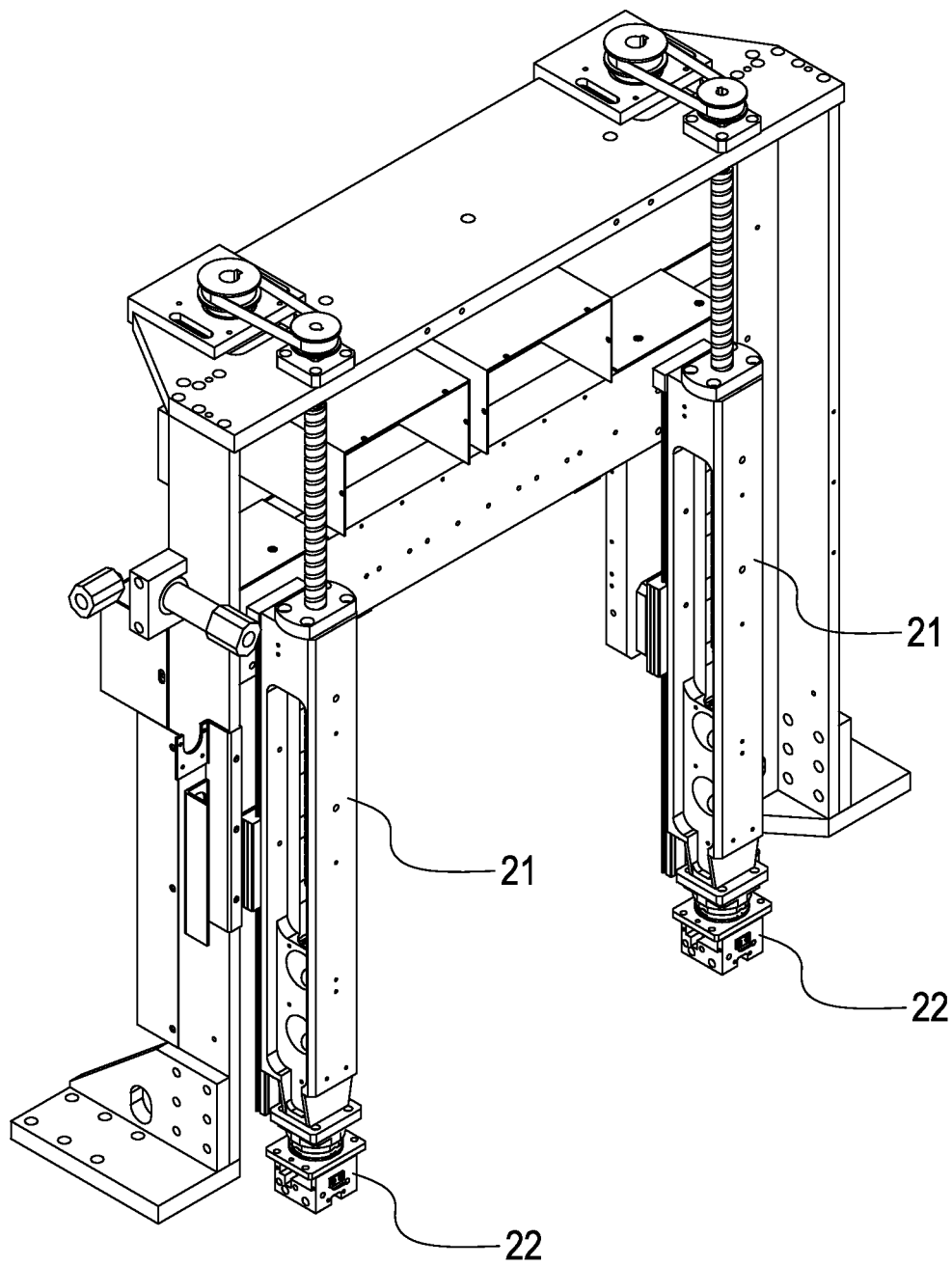
FIG. 1A and FIG. 1B illustrate the first embodiment of the test device of the present invention.
Figure 1B:
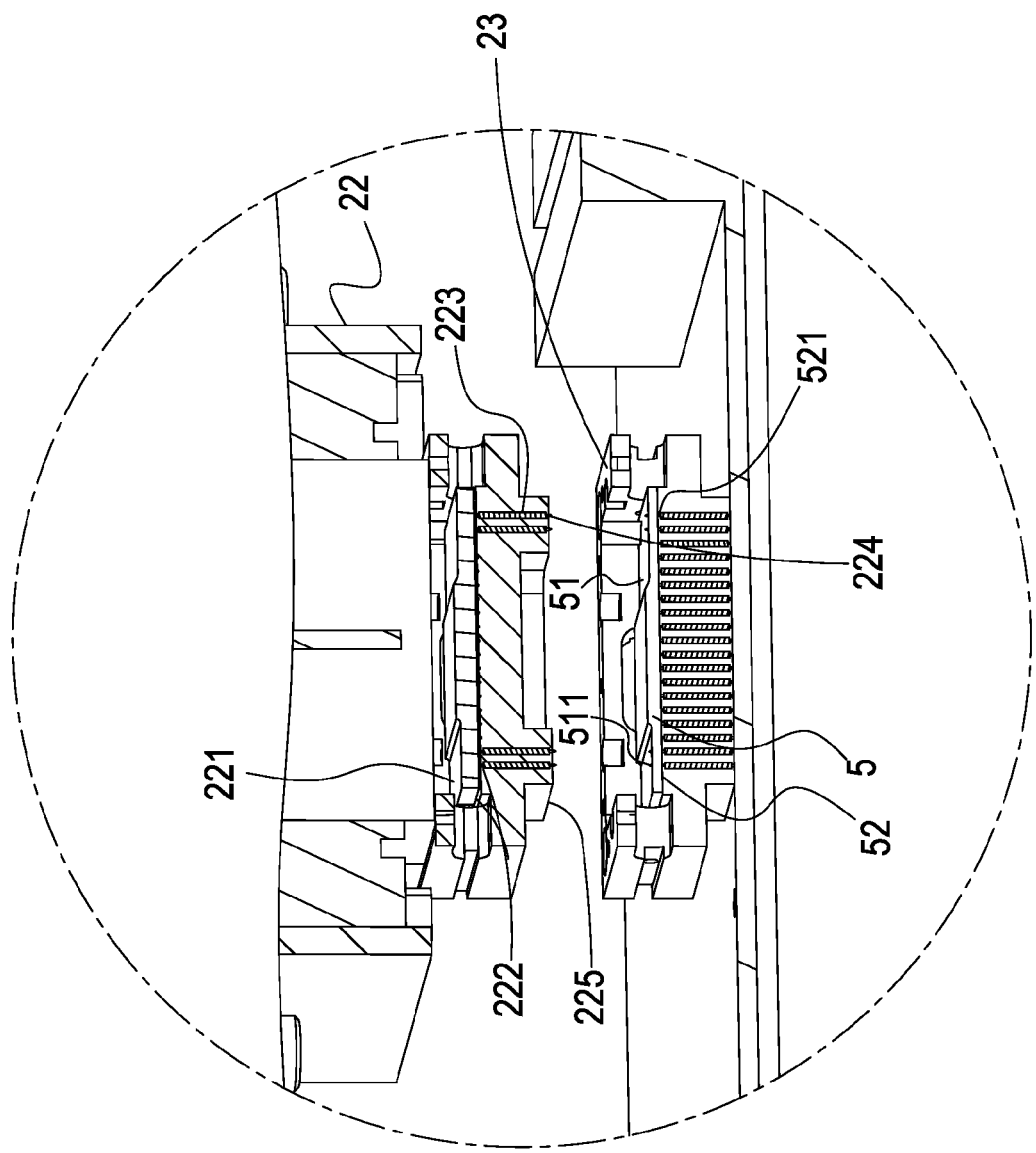

Please refer to FIG. 1A and FIG. 1B, which illustrate the first embodiment of the test device of the present invention. The test device comprises a test arm 21, a test head 22, a plurality of test contacts 224, and a test socket 23. The test device tests a bottom chip of a PoP stacked-chip. The upper surface 51 of the bottom chip 5 has a plurality of soldering points 511 for electrically connecting a plurality of corresponding soldering points 222 of a top chip 221 of the PoP stacked-chip. The plurality of test contacts 224 is installed on the lower surface 225 of the test head 22, and the plurality of test contacts 224 is electrically connected to the plurality of corresponding soldering points 222 of the top chip 221 inside the test head 22. When the lower surface 225 of the test head 22 contacts the upper surface 51 of the bottom chip 5, the plurality of test contacts 224 is electrically connected to the plurality of soldering points 511 so as to test the bottom chip 5. The top chip 221 inside the test head 22 is an accurately operative top chip of golden sample, so the bottom chip can be determined a fail when the test result comes to grief. In this way, the bottom chips can be classified before packaging the PoP stacked-chips, so the yield and cost of the PoP stacked-chips are improved.

The bottom chip 5 is contained in the test socket 23, and the test socket 23 is electrically connected to signal contacts 521 on the lower surface 52 of the bottom chip 5. The plurality of test contacts 224 can connect to the plurality of corresponding soldering points of the top chip 221 inside the test head 22 in different ways; for example, through the electric conductors of wires or probes, one end is connected to the plurality of corresponding soldering points 222 of the top chip 221, and the other end penetrates the test head 22 to electrically connect the plurality of test contacts 224. The test arm 21 is installed to the semiconductor test equipment, and driven by the group of screw rods, belts and wheels, so that the test arm 21 can move in the vertical direction over the test socket 23. When the test arm 21 moves downward close to the test socket 23 for the lower surface 225 of the test head 22 contacting the upper surface 51 of the bottom chip 5, the top chip 221 inside the test head 22 and the bottom chip 5 in the test socket 23 form a test loop.

Please refer to FIG. 2, which illustrates the second embodiment of the test device of the present invention. In this embodiment, the plurality of test contacts 224 is implemented by the plurality of test probes 223 electrically connected to the plurality of corresponding soldering points 222 of the top chip 221 inside the test head 22. The plurality of test contacts 224 comprises the plurality of test probes 223. The first end of the plurality of test probes 223 is electrically connected to the plurality of corresponding soldering points 222 of the top chip 221 inside the test head 22, and the second end of the plurality of test probes 223 extends outward from the lower surface 225 of the test head 22. When the test arm 21 moves downward in the vertical direction, the test head 22 is close to the test socket 23 so that the plurality of test probes 223 can contact the upper surface 51 of the bottom chip 5. The signal contacts 521 on the lower surface 52 of the bottom chip 5 are electrically connected to the test socket 23. Thus, the top chip 221 inside the test head 22 and the bottom chip 5 in the test socket 23 form a test loop.

Figure 3A:
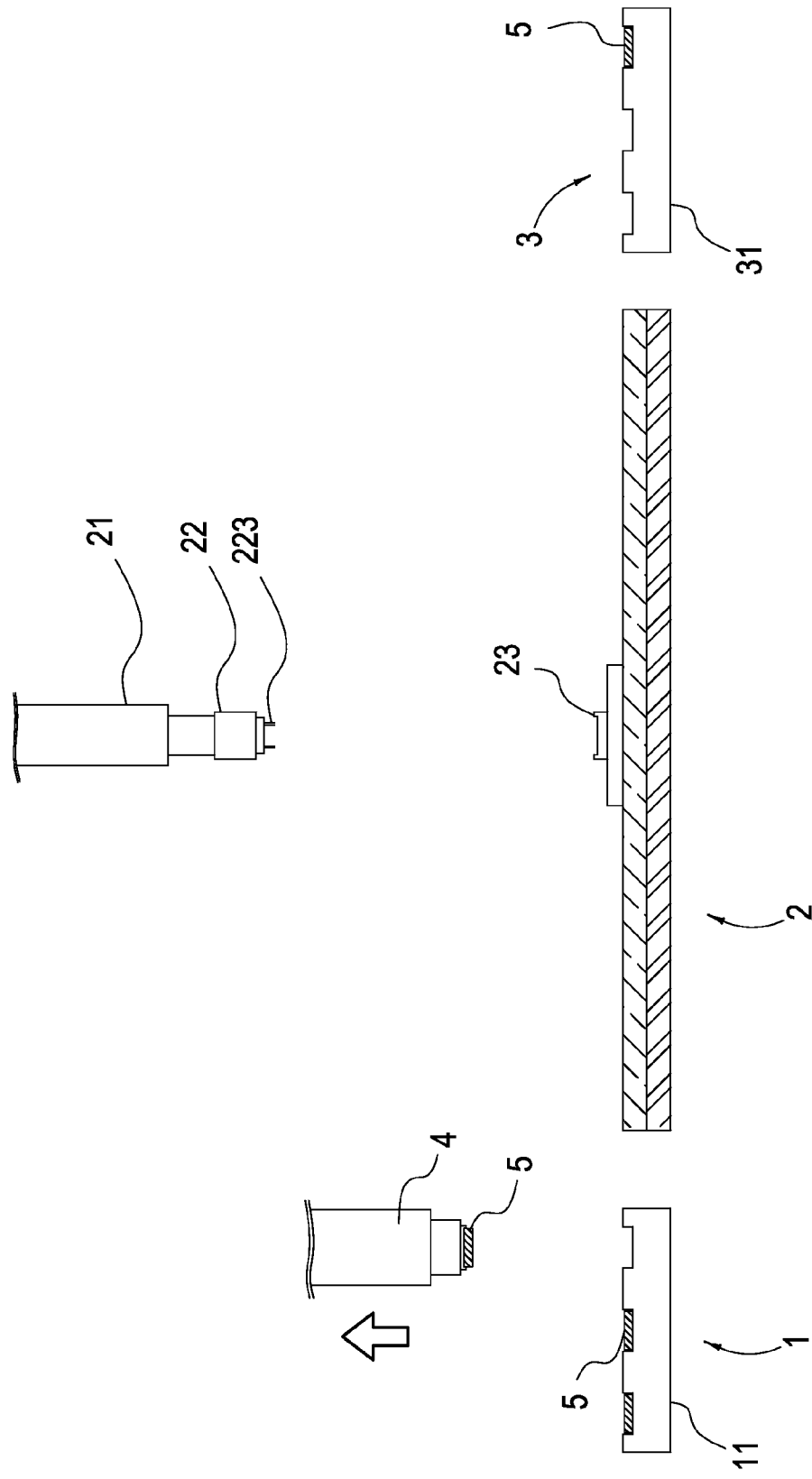
Figure 3B:
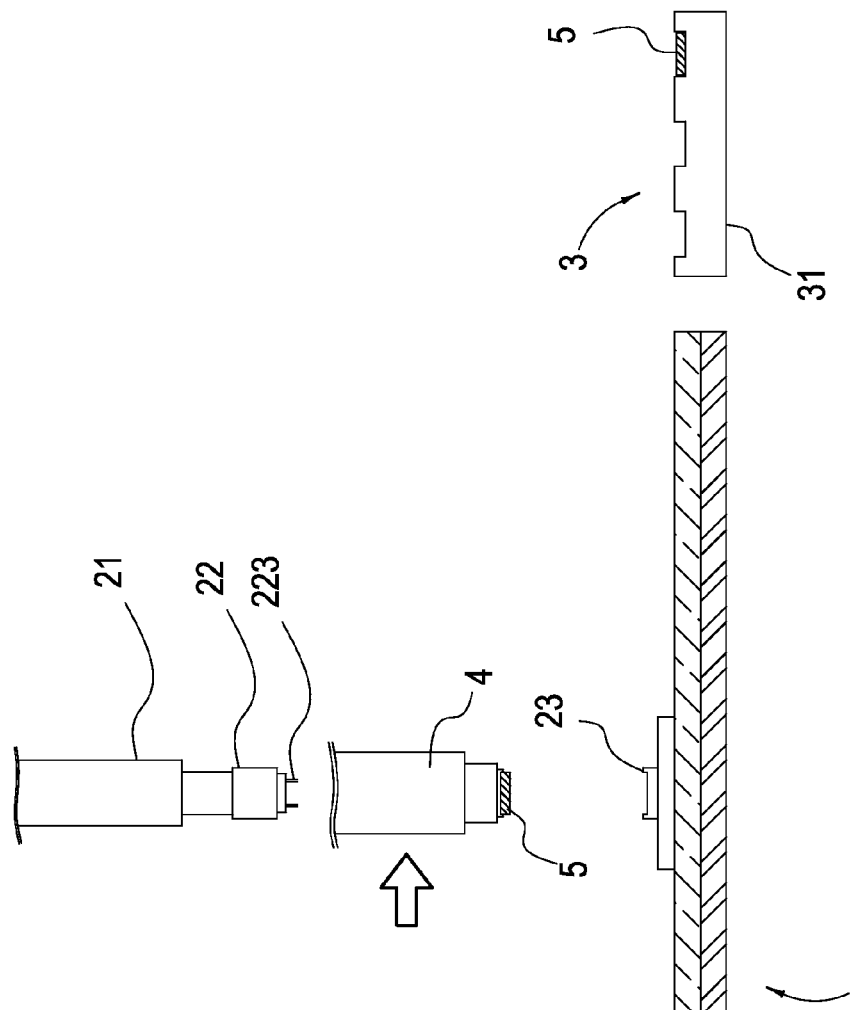
Figure 3C:
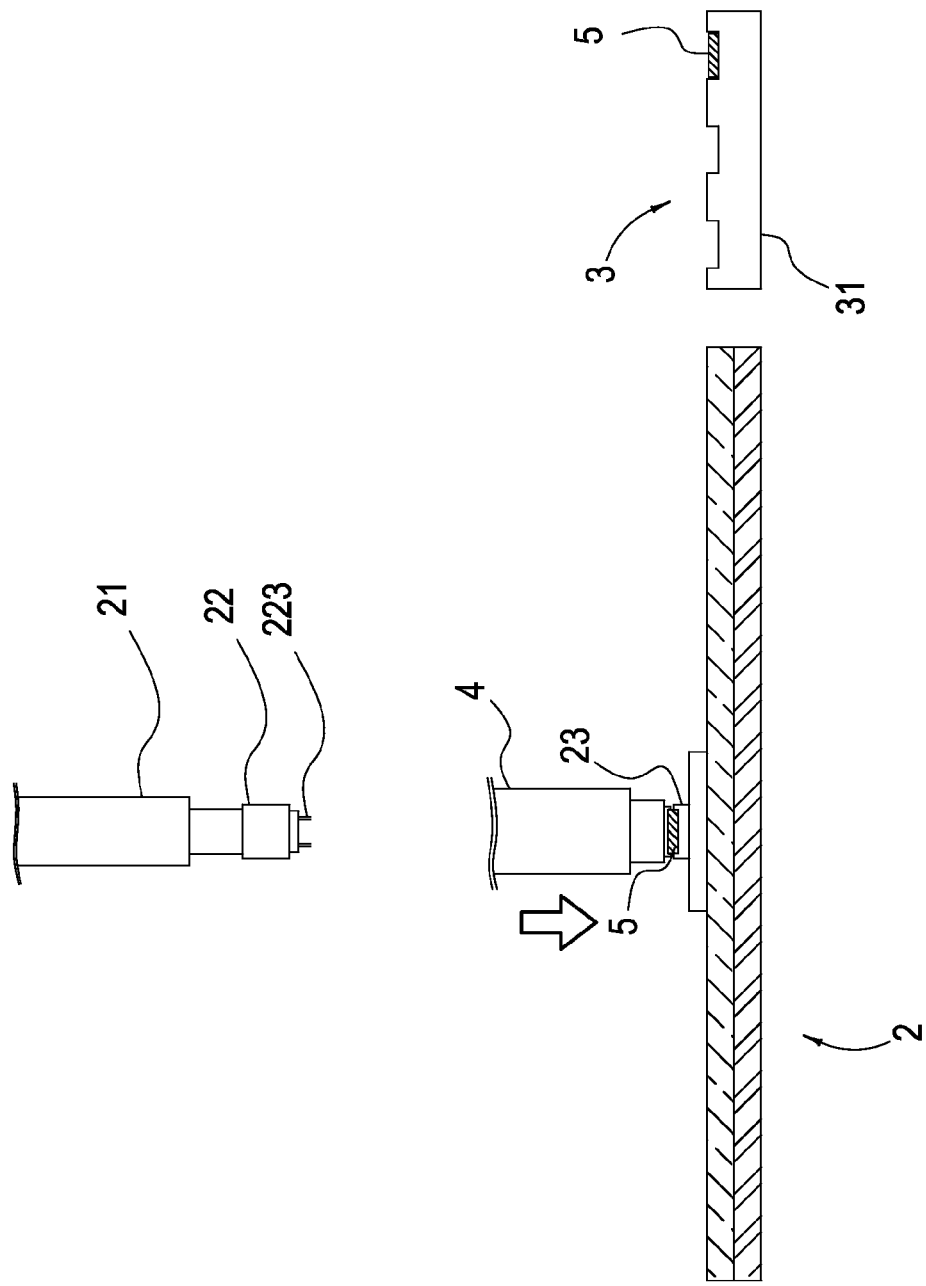
Figure 3D:
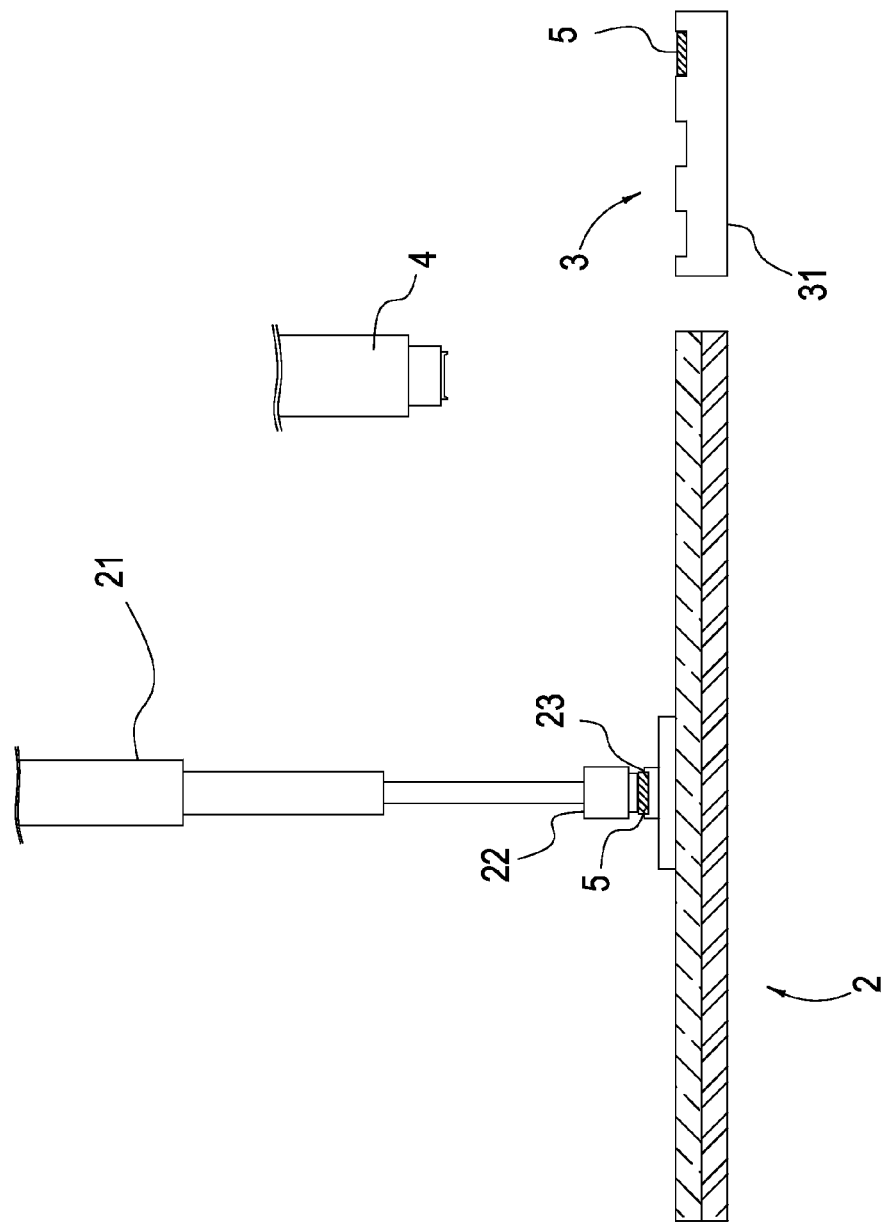
Figure 3F:
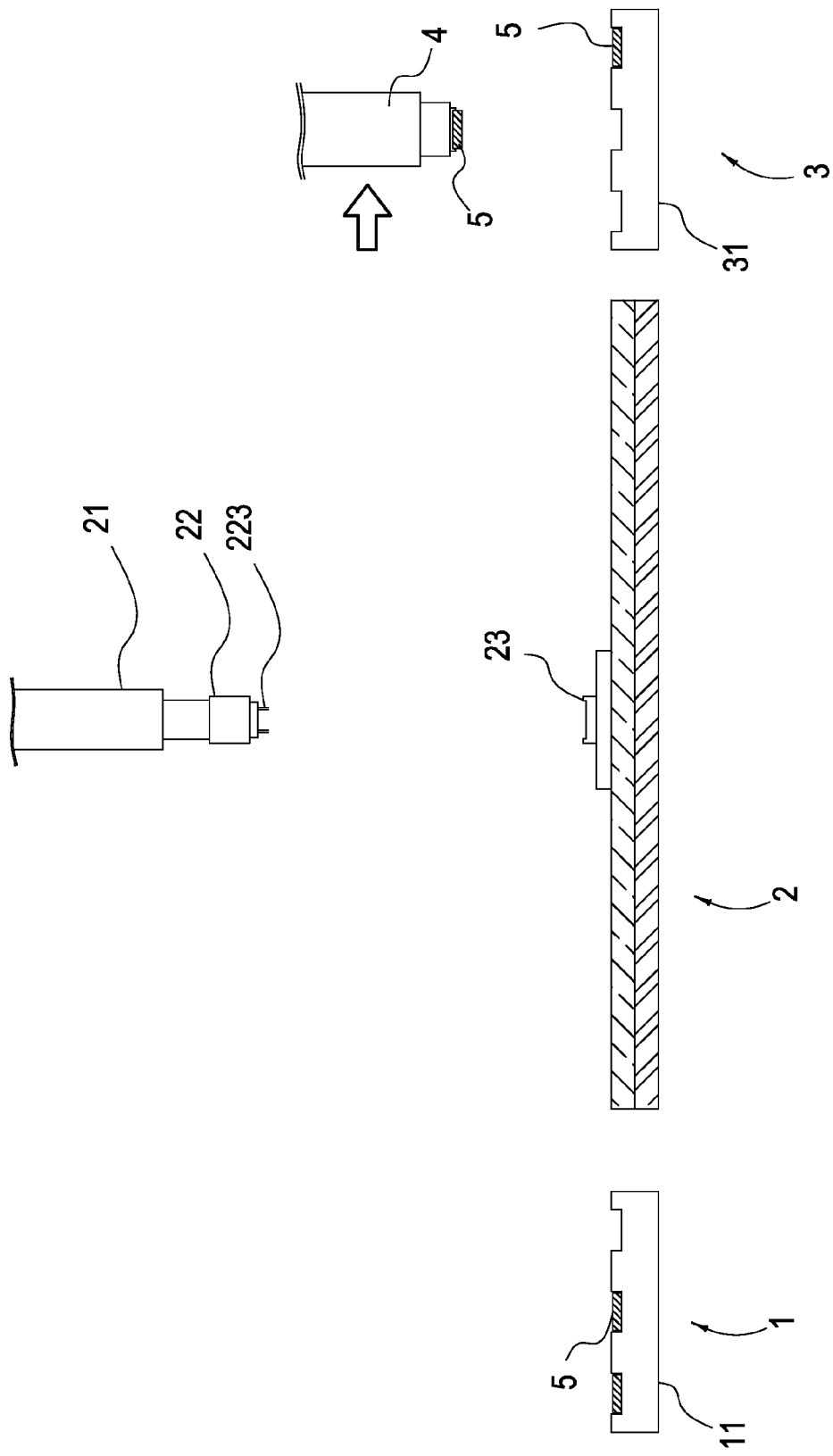
Figure 3G:
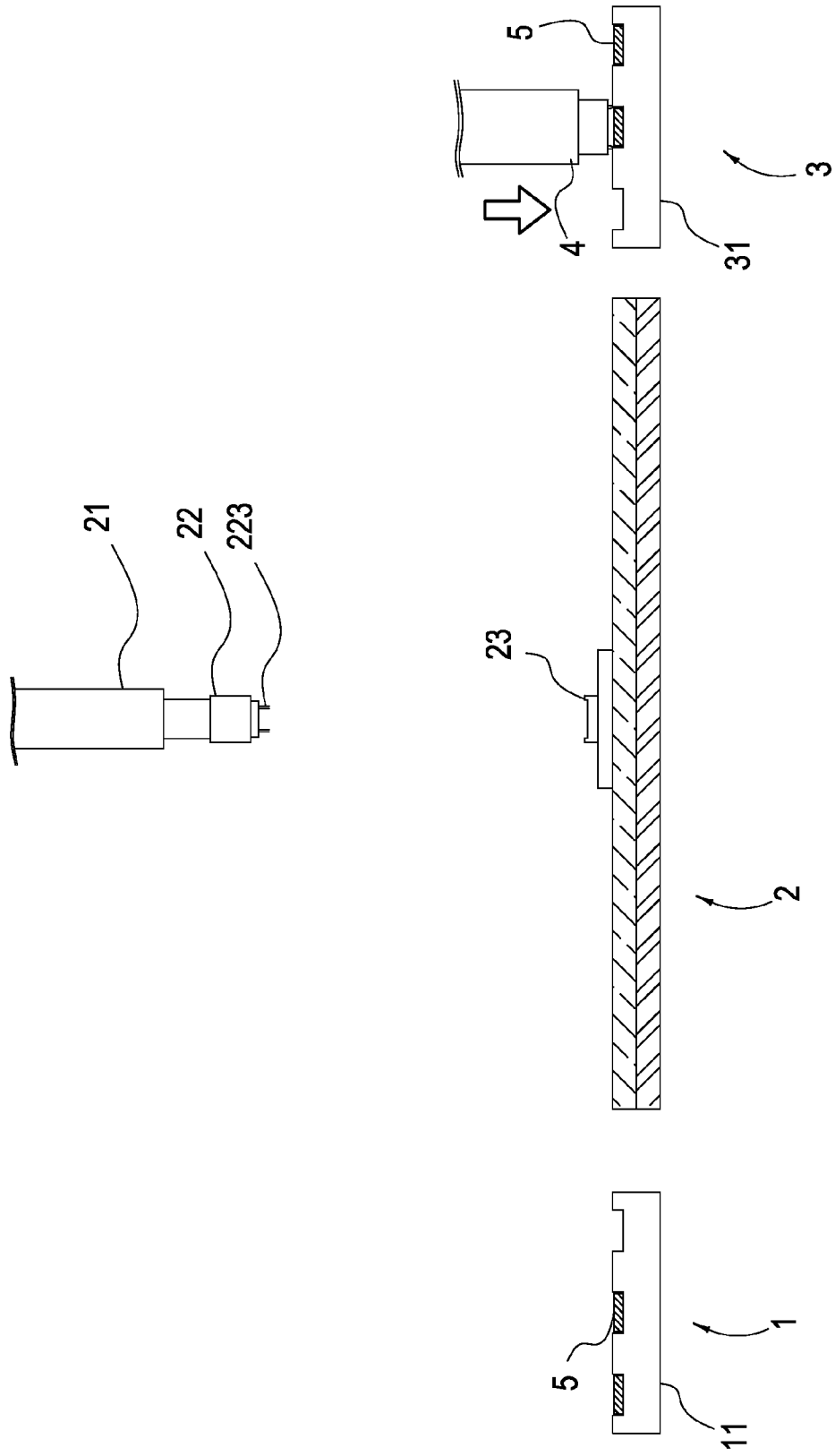

Please refer to FIG. 3A to FIG. 3G, which illustrate the operation of the test device in the first embodiment of the present invention. The test device of the present invention is used in the automation test equipment, so the operations of input, test and output are illustrated together in the following. As shown in FIG. 3A to FIG. 3C, a transport arm 4 carries the bottom chip 5 from a tray 11 in a charging area 1 to a test area 2; then, the test device tests the bottom chip 5 in the test area 2. As shown in FIG. 3D, the test arm 21 moves downward in the vertical direction for the test head 22 close to the test socket 23, so that the plurality of test probes 223 of the test head 22 can contact the soldering points 511 on the upper surface 51 of the bottom chip 5 in the test socket 23. Then, the top chip 221 inside the test head 22 and the bottom chip 5 in the test socket 23 form the test loop for testing the bottom chip 5. The number of the test area 2 can be configured according to the requirement, so the equipment can be alternatively installed with four or even six test areas, or only single test area; moreover, the transport arm 4 can be programmed group by group or one by one to carry the bottom chip 5 to the different test area 2 for the best test performance. As shown in FIG. 3E to FIG. 3F, the test arm 21 moves upward after completing the test, and then the transport arm 4 carries the bottom chip 5 to leave the test area 2. At last, as shown in FIG. 3G, the transport arm 4 carries the bottom chip 5 of completing the test to a discharging area 3, and then categorizes on a tray 31 in the discharging area 3.

Please refer to FIG. 4, which illustrates the third embodiment of the test device of the present invention. In this embodiment, the test device further comprises a nozzle 61 and an air flow passage 62, so the test device can vacuum absorb the bottom chip 5. Cooperating with the movement of the test arm 21, the test device functions as the transport arm 4. The nozzle 61 is installed about the center of the lower surface 225 of the test head 22. The air flow passage 62 penetrates the test head 22. One end of the air flow passage 62 connects to the nozzle 61, and the other end of the air flow passage 62 connects to an air compressor (not shown), for exhausting the air flow so as to generate the absorbing force. The first end of the plurality of test probes 223 is electrically connected to the plurality of corresponding soldering points 222 of the top chip 221 inside the test head 22, and the second end of the plurality of test probes 223 extends outward from the lower surface 225 of the test head 22, so the intersection of the air flow passage 62 and the plurality of test probes may have little air leakage, but this leakage does not lessen the absorbing force too much. In general, the material of the nozzle 61 is elastic rubber, so the height of the nozzle 61 can be at the same level of the plurality of test probes or higher. When the lower surface 225 of the test head 22 contacts the upper surface 51 of the bottom chip 5, the nozzle 61 is squeezed certainly. In the further embodiment, the plurality of test probes 223 can shrink backward and extend outward. When the test device vacuum absorbs the bottom chip 5, the second end of the plurality of test probes 223 shrinks backward, so that the nozzle 61 can protrude from the test probes 223; when the test device tests the bottom chip 5, the second end of the plurality of test probes 223 extends outward to protrude from the nozzle 61 so as to electrically connect the soldering points 511.

Figure 5B:
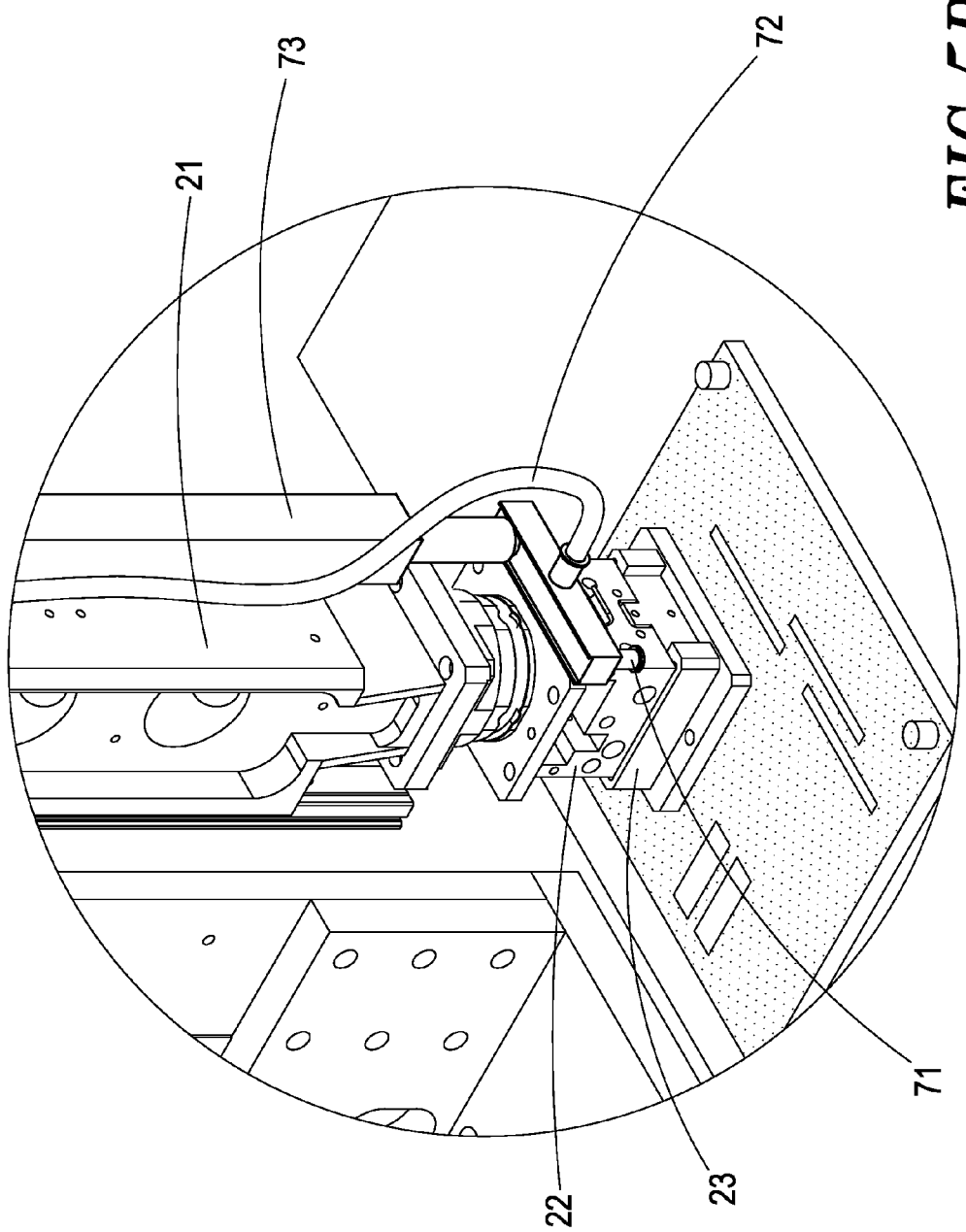

Please refer to FIG. 5A and FIG. 5B, which illustrate the fourth embodiment of the test device of the present invention. Comparing to the test head which can vacuum absorb the bottom chip by itself in the third embodiment, the test head in the fourth embodiment provides an additional vacuum absorbing module. The vacuum absorbing module is installed on the side of the test arm 21, and capable of moving to the lower end of the test arm 21 to cover the test head 22, for vacuum absorbing the bottom chip 5. The vacuum absorbing module comprises a nozzle 71, an air flow pipe 72, and a rotating arm 73. The rotating arm 73 is installed on the side of the test arm 21 and has an L-shaped end. The nozzle 71 is installed on the L-shaped end. One end of the air flow pipe 72 is connected to the nozzle 71, and the other end of the air flow pipe 72 is connected to the air compressor (not shown), for exhausting the air flow so as to generate the absorbing force. The rotating arm 73 can locate on the side of the test arm 21 or on the lower end of the test arm 21 to cover the test head 22. When the test device carries the bottom chip 5, as shown in FIG. 5A, the nozzle 71 locates on the lower end of the test arm 21, by means of the rotating arm 73 moving to the lower end of the test arm 21 and then rotating to cover the test head 22 by the L-shaped end, and cooperates with the movement of the test arm 21 for functioning as the transport arm 4. On the other hand, when the test device tests the bottom chip 5, as shown in FIG. 5B, the nozzle 71 locates on the side of test arm 21. Thus, the test head 22 can test the bottom chip 5 when the test arm 21 moves downward in the vertical direction close to the test socket 23.

Figure 6A:
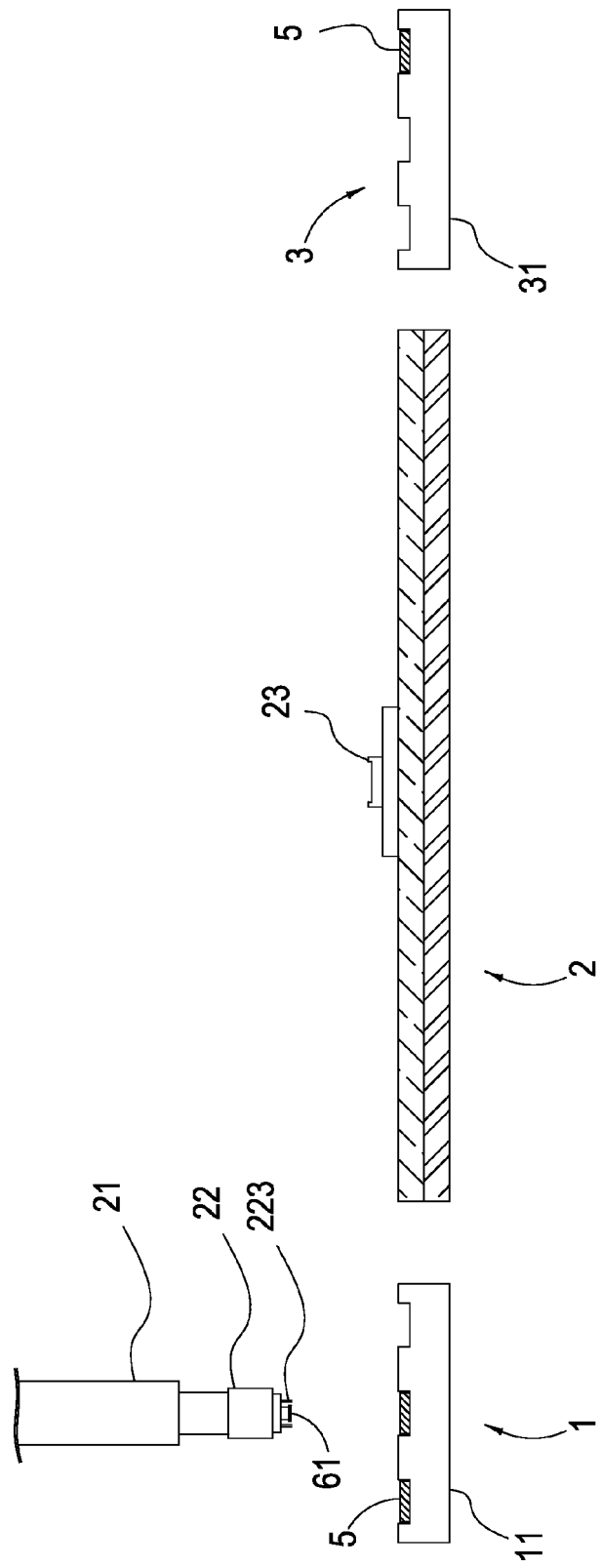

Please refer to FIG. 6A to FIG. 6C, which illustrate the operation of the test device in the third embodiment of the present invention. In the third embodiment, the test device comprises the nozzle 61 for vacuum absorbing the bottom chip 5. Cooperating with the movement of the test arm 21, the test device functions as the transport arm 4. As shown in FIG. 6A, the test arm 21 moves to the charging area 1. The test head 22 utilizes the nozzle 61 to vacuum absorb the bottom chip 5 from the tray 11; then, the test arm 21 moves to the test area 2 so as to carry the bottom chip 5 to the test area 2 and test the bottom chip 5 in the test area 2. The operation in FIG. 6A corresponds to FIG. 3A to FIG. 3C. As shown in FIG. 6B, when the test arm 21 carries the bottom chip 5 to the test socket 23, the test head 22 moves close to the test socket 23. Then, when the nozzle 61 stops vacuum absorbing the bottom chip 5, the plurality of test probes 223 of the test head 22 contacts the plurality of soldering points 511 on the upper surface 51 of the bottom chip 5, so that the top chip 221 inside the test head 22 and the bottom chip 5 in the test socket 23 can form the test loop for testing the bottom chip 5. As shown in FIG. 6C, after completing the test, the test head 22 utilizes the nozzle 61 to vacuum absorb the bottom chip 5, and the test arm 21 moves upward and carries the bottom chip 5 to leave the test area 2. Then, the test arm 21 carries the bottom chip 5 of completing the test to the discharging area 3, and categorizes on a tray 31 in the discharging area 3. The operation in FIG. 6C corresponds to FIG. 3E to FIG. 3G. Accordingly, the benefit that the test device has the absorbing function is obvious. Comparing the operations of the first embodiment, the operations of the third embodiment is much easier; in addition to test time reduction, the bottom chip 5 carried by the test head 22 prevents from alignment of the test head 22 and the test socket.

In conclusion, the present invention provides a test device for a PoP stacked-chip. The test device comprises a test head having a top chip of the PoP stacked-chip installed inside, so the test device according to the present invention can eliminate the failed bottom chips before package stacking of the top chip and the bottom chip, for improving the yield of the stacked-chip. Moreover, the test device according to the present invention can vacuum absorb the bottom chip, so the bottom chip can be carried directly by the test head and the test arm instead of the transport arm, which improves the throughput.

Through the aforementioned detailed descriptions for the preferred embodiments according to the present invention, it is intended to better illustrate the characteristics and spirit of the present invention rather than restricting the scope of the present invention to the preferred embodiments disclosed in the previous texts. On the contrary, the objective is to encompass all changes and effectively equivalent arrangements within the scope of the present invention as delineated in the following claims of the present application.

What is claimed is:

1. A test device for testing a bottom chip of a package-on-package (PoP) stacked-chip, an upper surface of the bottom chip having a plurality of soldering points for electrically connecting a plurality of corresponding soldering points of a top chip of the PoP stacked-chip, the test device comprising:
   a test head, having the top chip installed inside;
   a test arm, capable of moving in a vertical direction, having a lower end for installing the test head;
   a vacuum absorbing module, installed on a side of the test arm, and capable of moving to the lower end of the test arm to cover the test head, for vacuum absorbing the bottom chip, wherein the vacuum absorbing module comprises:
      a rotating arm, installed on the side of the test arm, having an L-shaped end, capable of moving in the vertical direction corresponding to the test arm, and rotating to cover the test head by the L-shaped end when the rotating arm moves to the lower end of the test arm;
      a nozzle, installed on the L-shaped end; and
      an air flow pipe, connected to the nozzle, for exhausting the air flow so as to generate an absorbing force; and
   a plurality of test contacts, installed on a lower surface of the test head, and electrically connected to the plurality of corresponding soldering points of the top chip inside the test head,
   wherein when the lower surface of the test head contacts the upper surface of the bottom chip, the plurality of test contacts is electrically connected to the plurality of soldering points for testing the bottom chip.

2. The test device according to claim 1, further comprising:
   a test socket, for containing the bottom chip, the test socket electrically connected to signal contacts on a lower surface of the bottom chip,
   wherein when the test arm moves downward close to the test socket so that the lower surface of the test head can contact the upper surface of the bottom chip, the top chip inside the test head and the bottom chip in the test socket form a test loop.

3. The test device according to claim 1, wherein the plurality of test contacts comprises a plurality of test probes, first ends of the plurality of test probes electrically connected to the corresponding soldering points of the top chip inside the test head, and second ends of the test probes extending outward from the lower surface of the test head.

4. A test device for testing a bottom chip of a package-on-package (PoP) stacked-chip, an upper surface of the bottom chip having a plurality of soldering points for electrically connecting a plurality of corresponding soldering points of a top chip of the PoP stacked-chip, the test device comprising:
   a test head, having the top chip installed inside,
   a plurality of test probes, first ends of the plurality of the test probes electrically connected to the corresponding soldering points of the top chip inside the test head, and second ends of the test probes extending outward from a lower surface of the test head;
   a nozzle, installed about the center of the lower surface of the test head, for vacuum absorbing the bottom chip; and
   an air flow passage, penetrating the test head and connecting the nozzle, for exhausting the air flow so as to generate the absorbing force,
   wherein when the test device vacuum absorbs the bottom chip, the second ends of the test probes shrinks backward to the lower surface of the test head, so that the nozzle can protrude from the test probes; when the test device tests the bottom chip, the second ends of the plurality of test probes extend outward to protrude from the nozzle so as to electrically connect the soldering points.

5. The test device according to claim 4, further comprising:
   a test arm, capable of moving in a vertical direction, having a lower end for installing the test head.

6. The test device according to claim 5, further comprising:
   a test socket, for containing the bottom chip, the test socket electrically connected to signal contacts on a lower surface of the bottom chip,
   wherein when the test arm moves downward close to the test socket so that the lower surface of the test head can contact the upper surface of the bottom chip, the top chip inside the test and the bottom chip in the test socket form a test loop.

* * * * *